(12) United States Patent
Rategh

(10) Patent No.: US 7,173,406 B2
(45) Date of Patent: Feb. 6, 2007

(54) METHOD AND APPARATUS FOR GAIN CONTROL

(75) Inventor: Hamid Reza Rategh, Cupertino, CA (US)

(73) Assignee: Anadigics, Inc., Warren, NJ (US)

( * ) Notice: Subject to any disclaimer, the term of this patent is extended or adjusted under 35 U.S.C. 154(b) by 321 days.

(21) Appl. No.: 10/927,363

(22) Filed: Aug. 26, 2004

(65) Prior Publication Data

US 2005/0285675 A1   Dec. 29, 2005

Related U.S. Application Data

(63) Continuation-in-part of application No. 10/875,819, filed on Jun. 24, 2004, now Pat. No. 7,019,508.

(51) Int. Cl.
*G05F 3/16* (2006.01)
(52) U.S. Cl. ............... 323/314; 323/315; 327/543; 330/254

(58) Field of Classification Search ............... 323/312, 323/313, 314, 315, 316; 327/540, 541, 543, 327/545, 546; 330/253, 254, 256, 257
See application file for complete search history.

(56) References Cited

U.S. PATENT DOCUMENTS

| | | | | |
|---|---|---|---|---|
| 5,834,967 A | * | 11/1998 | Kuroda et al. | 327/543 |
| 6,094,041 A | * | 7/2000 | Wachter | 323/315 |
| 6,831,505 B2 | * | 12/2004 | Ozoe | 327/541 |
| 2005/0285586 A1 | * | 12/2005 | Rategh et al. | 323/314 |

* cited by examiner

*Primary Examiner*—Jessica Han
(74) *Attorney, Agent, or Firm*—H. Black P.E.

(57) ABSTRACT

A method and apparatus for power amplifier gain control is provided, such as may be embodied as an integrated circuit is disclosed. Embodiments provide for a continuously variable gain control at low cost as contrasted two-state or multi-state capabilities of previously developed solutions.

Improved consistency and control over gain may be provided using features disclosed.

11 Claims, 9 Drawing Sheets

METHOD AND APPARATUS FOR GAIN CONTROL

RELATED APPLICATIONS

This application is a continuation-in-part of U.S. patent application Ser. No. 10/875,819 filed Jun. 24, 2004 now U.S. Pat. No. 7,019,508 entitled TEMPERATURE COMPENSATED BIAS NETWORK, having a common inventor (Dr. Hamid R. Rategh) and common sole assignee and which is wholly incorporated herein by this reference.

This application is also related to U.S. patent application Ser. No. 10/760,698 filed Jan. 20, 2004 entitled METHOD AND APPARATUS FOR OPTIMIZATION OF AMPLIFIER WITH ADJUSTABLE OUTPUT RANGE, also having a common inventor (Dr. Hamid R. Rategh).

FIELD OF THE INVENTION

The invention generally relates to electronics circuits. The invention more particularly relates to amplifier circuits, for example, RF (radio frequency) PA (power amplifier) circuits especially integrated circuits for microwave signals.

BACKGROUND OF THE INVENTION

Modern designs for high power and high performance RF power amplifiers, of conventional design and embodied as ICs (integrated circuits), face considerable challenges. One such challenge is the avoidance of significant reduction of energy efficiency reduction whenever output power level is adjusted to values below the peak design output power. Maintaining efficiency at various RF output power levels is an important requirement for radios that are designed to save battery power as a result of reduced power operation. Generally speaking, the power efficiency of power amplifiers operated at small signal levels will be poor unless the amplifier incorporates features expressly to remedy that incipient deficiency.

Modern designs for high power and high performance ICs (integrated circuits) RF (radio frequency) signals meet their considerable challenges by deploying any of a variety of technologies, often including out of the mainstream techniques. Dense and highly integrated designs for processing analog signals often have a very limited electrical operating range and, especially when power supply low voltages must be conformed to, such circuits may require bias currents (and/or voltages) to be controlled with great precision and robustness.

Use of the disclosed circuits and methods enables RF power amplifiers to be constructed with economy, with excellent energy efficiency thus permitting sound energy management and allowing many different power levels to be implemented thus allowing still further improvements to the energy efficiency of the total transmitter by precisely using the optimal desirable power output level.

The disclosed improved circuit designs are capable superior tradeoffs between circuit performance and cost.

SUMMARY

Accordingly, the invention provides RF amplifier gain control circuits with superior performance. Such gain control circuits may be implemented as an IC (integrated circuit) with bipolar transistors as disclosed herein. However the invention is not limited to bipolar devices, or even necessarily to dense integrated, although that is usual and usually desirable. CMOS or other semiconductor technologies such as GaAs (Gallium Arsenide) or InP (Indium Phosphate) or other III–IV semiconductor devices may also be used. High operating frequency (e.g., microwave) may be supported through LSI (large scale integration), as is well-known in the art. Superior performance results from aspects of the novel designs.

According to a first aspect of the invention, a circuit for gain control is disclosed, the circuit comprising an input transistor; a first buffer transistor; a leakage block operable to pass the first leakage current and further operable to generate a first leakage voltage proportional to the first leakage current; an output transistor and a second buffer transistor. The circuit may generate a buffer transistor control voltage in proportion to an input current, and an input transistor control voltage in linear relationship to the first leakage current. Thus, the circuit may generate the input current by summation of a fixed component and a control current component from a controlling adjustable current source, According to another aspect of the invention method is disclosed which may exploit the methods of the first aspect.

Several variants of these aspects are also disclosed together with alternative exemplary embodiments.

BRIEF DESCRIPTION OF THE DRAWINGS

The accompanying drawings, which are incorporated in and constitute a part of the specification, illustrate an embodiment of the invention, and, together with the description, serve to explain the principles of the invention.

For convenience in description, identical components have been given the same reference numbers in the various drawings.

DETAILED DESCRIPTION OF THE PREFERRED EMBODIMENTS

Figure 1:
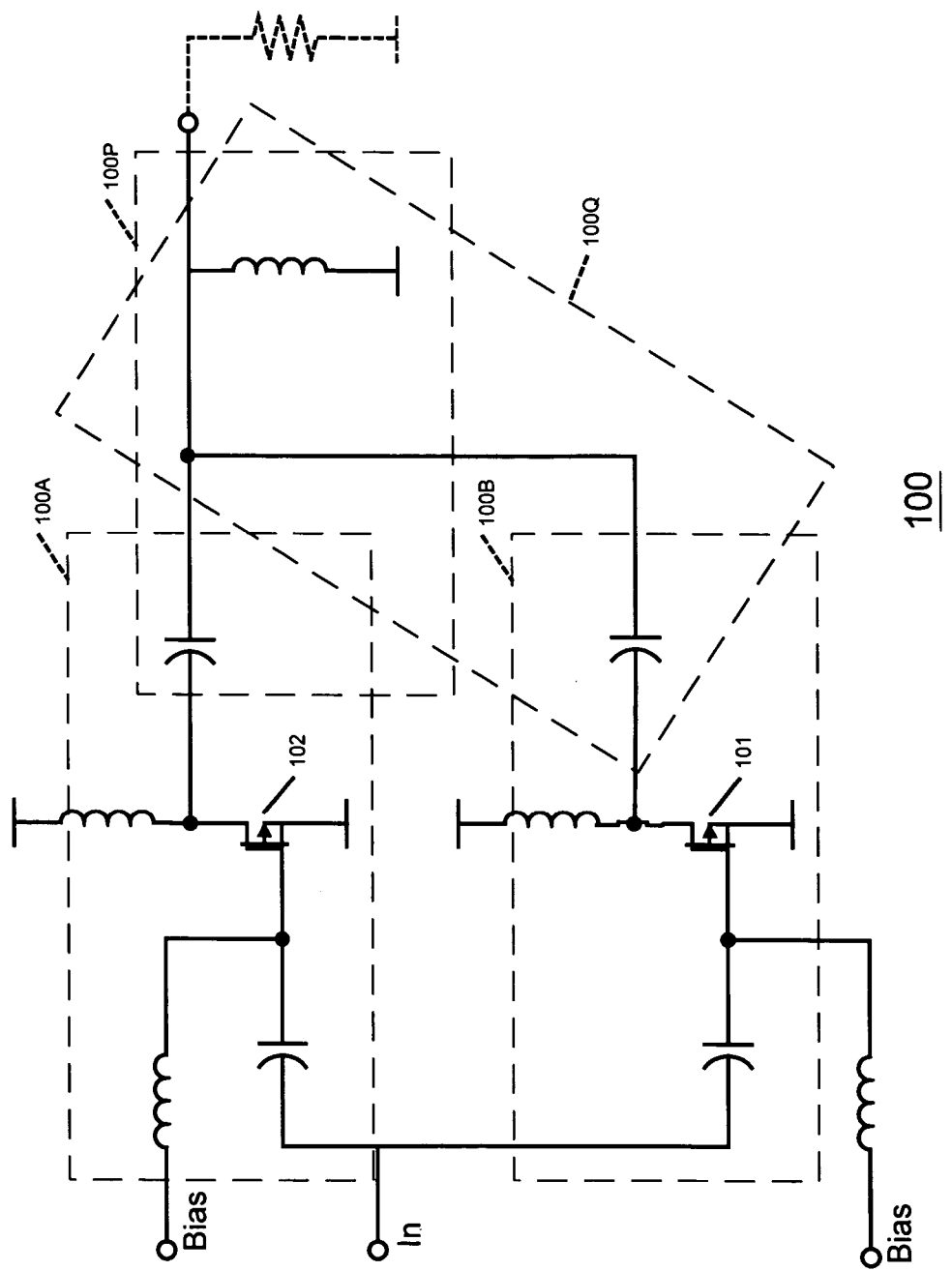
FIG. 1 is a schematic diagram of a part of an integrated circuit according to an embodiment of a RF amplifier disclosed in a prior application.

In the following description, for purposes of clarity and conciseness of the description, not all of the numerous components shown in the schematics and/or drawings are described. The numerous components are shown in the drawings to provide a person of ordinary skill in the art a thorough, enabling disclosure of the present invention. The operation of many of the components would be understood and apparent to one skilled in the art.

FIG. 1 is a schematic diagram of a part of an integrated circuit 200 (IC) according to an embodiment of a RF amplifier disclosed in a prior application of inventors Rategh and Soltan, U.S. patent application Ser. No. 10/760,698. As shown, IC 100 implements an analog RF PA (power amplifier) circuit. As a power amplifier, IC 100 may produce relatively high power levels such as might typically be needed in connection with a transmitter driving a radiating antenna. NMOS transistors (n-channel metal-oxide semiconductor field-effect transistors) are shown in the circuit but comparable circuits may be constructed using PMOS transistors (p-channel metal-oxide semiconductor field-effect transistors), BJTs (Bipolar junction transistors, typically Silicon based) or other active solid-state devices.

Major components of IC 100 may be two amplifiers 100A, 100B having outputs that are summed at a summing node 100N. In this exemplary embodiment, two subsystem impedance matching networks 100P, 100Q may also be identified.

The IC 100 of FIG. 1 may be usefully operated in at least two modes:

In a first mode transistors 101 and 102 may be biased in an active or fully-on region and amplifiers 100A, 100B contribute substantially equally to produce approximately maximum designed power output level.

In a second mode amplifier 100A operates at a similar load point to in the first mode but typically with a different match and amplifier 100B contributes little or no gain. Thus power level is reduced by typically more than 3 dB.

Careful and innovative design permits transistors to either operate at substantially their optimal operating point or alternatively be mostly or completely cut-off thus maintaining good energy efficiency while avoiding mismatch generated reflections and/or undesirable voltage excursions.

However previous implementations such as that outlined above provide good energy efficiency at relatively few power levels or operating modes. The present invention permits, inter alia, operation at an unlimited number or at continuously variable power levels with good energy efficiency. This is sometimes termed analog gain control as contrasted with digital or mode-oriented gain control.

Figure 2:
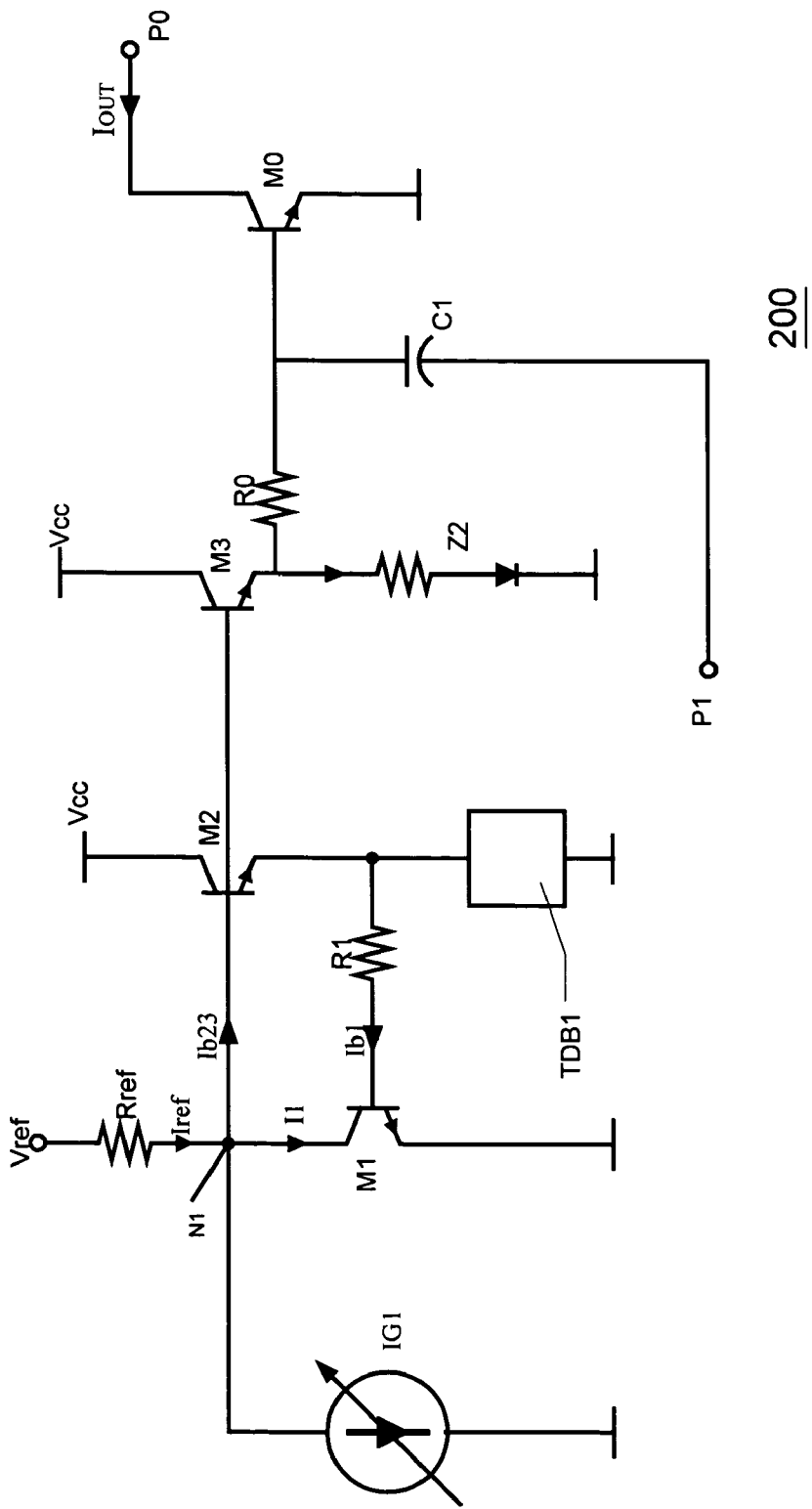
FIG. 2 is a schematic diagram of a part of another integrated circuit according to an embodiment of an analog RF circuit of an exemplary embodiment of the invention.

FIG. 2 is a schematic diagram of a part of another integrated circuit 200 according to an embodiment of an analog RF circuit of an exemplary embodiment of the invention. As shown, IC 200 implements an exemplary analog PA (power amplifier) circuit, and in the present example bipolar technologies are used. The circuit may be conventionally energized such as with positive ($V_{CC}$) and ground rails as shown or otherwise.

Referring to FIG. 2, the circuit 200 operates as an RF PA providing an RF output current $I_{OUT}$ at output port P0. $I_{OUT}$ typically consists of a 0 Hz (DC) component I0 and an RF component $I_{RF}$. In a typical embodiment output transistor M0 may be a device intended to be biased into an active region so as to act as a transistor that receives an RF input signal.

Still referring to FIG. 2, an RF input signal is introduced to the circuit at RF input port P1 conducted though DC blocking capacitor C1 and amplified by output transistor M0. The gain of transistor M0 is largely controlled by its operating point, which is highly correlated with the 0 Hz component I0 of the output current.

Still referring to FIG. 2, the operating point of output transistor M0 depends on the 0 Hz component of its base-emitter voltage which is in turn controlled by the other parts of the circuit.

As explained in the parent application, quiescent current, as hence gain and power output level of output transistor M0 is monotonically related to input current I1 into transistor M1. Buffer transistors M2 and M3 act to improve the circuit performance by reducing the currents into the bases of transistors M1 and M0 respectively. Ballast resistors R1 and R0 are not critical but may typically be provided to limit base currents and help prevent thermal runaways. Also TDB (temperature-dependent block) TDB1 may act to provide a desired performance characteristic over operating temperature. In some embodiments TDBs may preferable be active circuits having transistors connected in circuits comparable to transistor current mirrors. Load Z2 may be a voltage-dropping load, for example, a resistance or diode junction or, optionally as shown, both. A typically desired characteristic may be to hold output power substantially constant over a rated range of operating temperatures.

Since gain and hence output power level depends critically upon input current I1 into transistor M1 consideration will now be given to that current. Base current Ib23 into transistors M2, M3 is negligible compared with I1 and may be ignored in calculating a value for I1. Thus input current I1 is set in accordance with Kirchoff current summation by adjustable current source IG1 and by fixed reference current Iref (the latter of which itself may be set by a reference voltage source Vref and ohmic resistance Rref, or otherwise). Since the bases of transistors M2, M3 are connected their base voltages will be equal and since the base current Ib1 into transistor M1 is proportional to both input current I1 and voltage across base resistor R1 an active feedback loop is formed comprising transistors M1 and M2 which causes 0 Hz current component I0 in output transistor M0 to be determined by input current I1. Temperature dependent block TDB1 and voltage-dropping load Z2 act as two leakage blocks to generate appropriate leakage voltages in proportion to respective leakage currents so as to drive the desired voltages and hence currents into the bases of transistors M1 and M0 respectively.

Thus, still referring to FIG. 2, according to this embodiment of the invention, output RF power may be controlled by adjustable current source without changing the load on output transistor M0. As discussed, changing output load would bring several disadvantages that are happily avoided by the invention.

Figure 3:
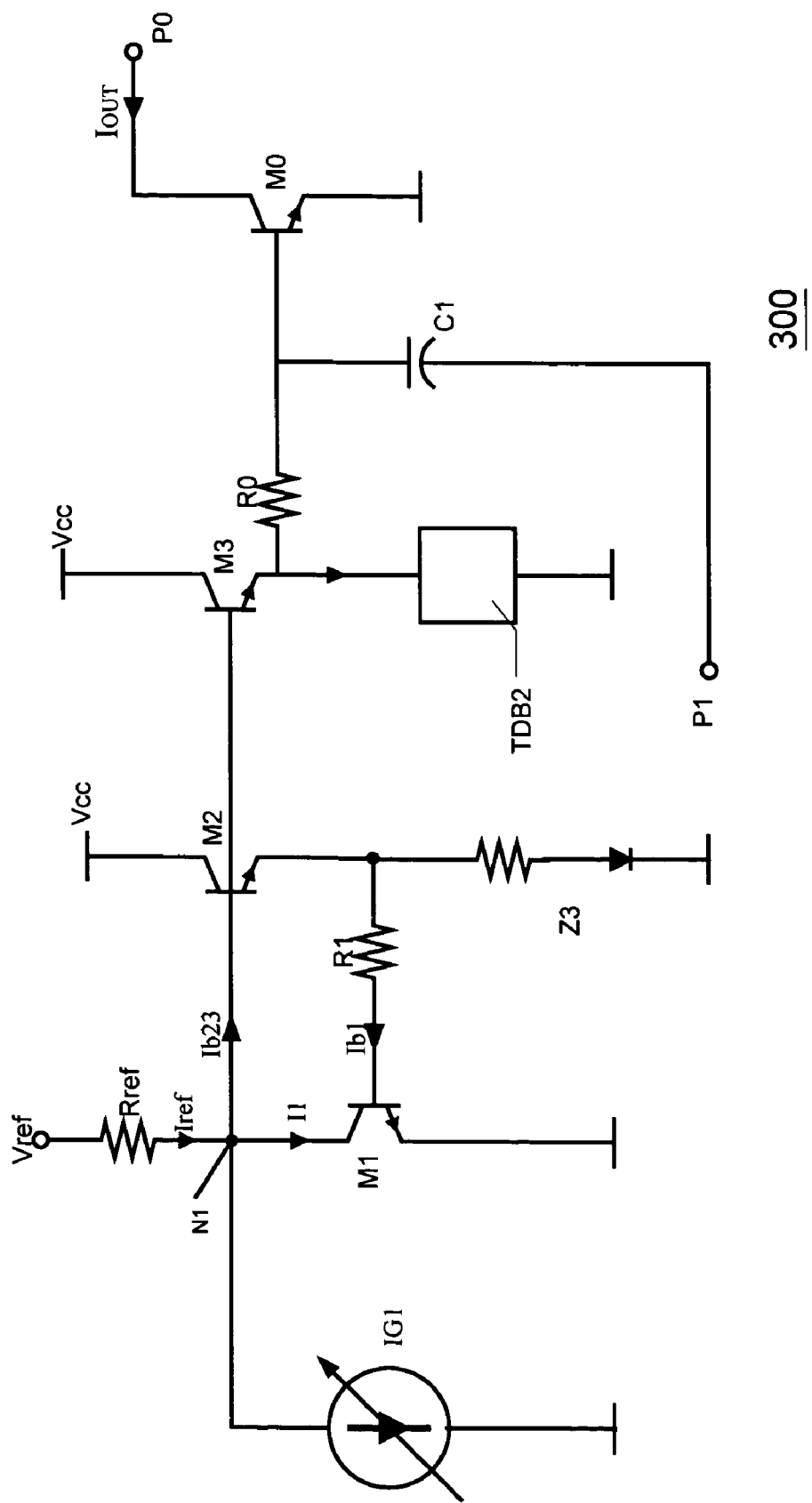
FIG. 3 is a schematic diagram of a part of another integrated circuit according to another embodiment of an analog RF circuit of an exemplary embodiment of the invention.

FIG. 3 is a schematic diagram of a part of another integrated circuit 300 according to another embodiment of an analog RF circuit of an exemplary embodiment of the invention. As contrasted with FIG. 2, the position of the temperature dependent block TDB2 is different, and consequently load Z3 is introduced (Z3 has a similar purpose to load Z2 of FIG. 2). Indeed the TDB may be dispensed with altogether in some embodiments within the general scope of the invention.

Figure 4B:
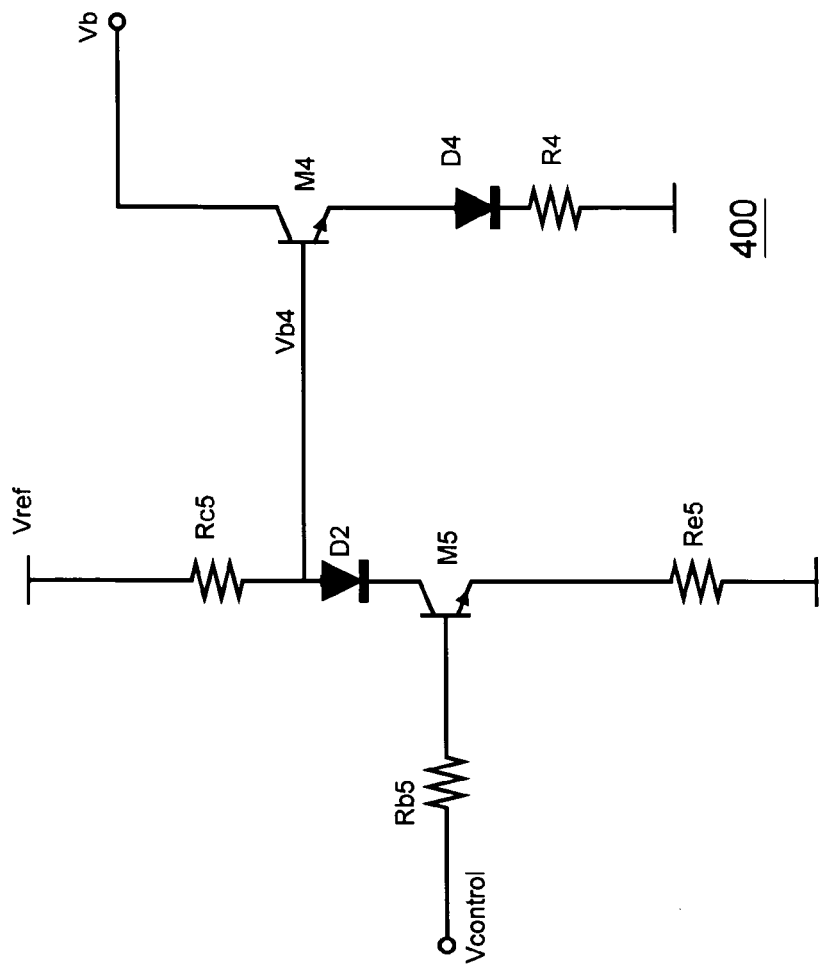
FIG. 4B shows a further exemplary adjustable current source according to an embodiment of the invention.
Figure 4A:
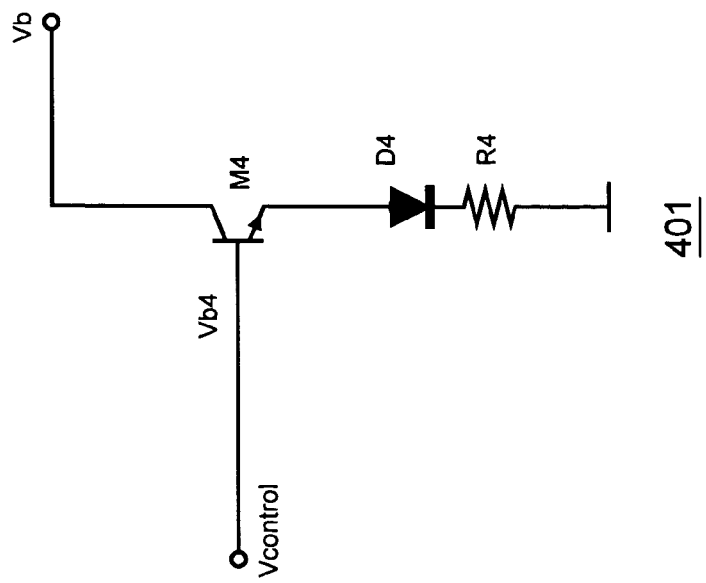
FIG. 4A shows an exemplary adjustable current source according to an embodiment of the invention.

FIG. 4A shows an exemplary adjustable current source according to an embodiment of the invention. The current generated or sunk by adjustable current source 401 is controlled by voltage Vcontrol and hence the base voltage Vb4 at transistor M4. Diode D4 and resistance R4 may act to limit current and set quiescent operating point. Alternative embodiments of the invention may omit diode D4 and/or resistance R4 and limit current by other techniques well known in the art. The change in output voltage Vb of adjustable current source 401 equals load resistance Rref (FIG. 2) multiplied by the delta current generated. The output voltage Vb may appear at node N1 (FIGS. 2 and 3).

FIG. 4B shows a further exemplary adjustable current source 400 according to an embodiment of the invention. This circuit may be considered an improvement with respect to the circuit of FIG. 4A. Referring to FIG. 4B, the circuit effectively adds an inverter in which resistance Rc5 acts as a pull up resistor with any suitable supply voltage, such as the Vref of FIG. 2. In a typical embodiment, Vref may be approximately 2.85 volts. Optional diode D2 helps to limit the total current from Vref down that leg of the circuit and may be omitted in some embodiments. The use of D2 does permit the use of a smaller value for resistance Rc5 and hence enables a more economic embodiment. Contrasting the circuits of FIGS. 4A and 4B, the circuit of FIG. 4B provides a transistor turn-on point of approximately 2 Vbe (twice the typical transistor base to emitter voltage) as contrasted with roughly half that amount for the circuit of FIG. 4A. The turn-on point 2 Vbe might have a typical value of about 2.4 volts if the IC is embodied using GaAs, HBT (Heterojunction-bipolar transistor).

Figure 5:
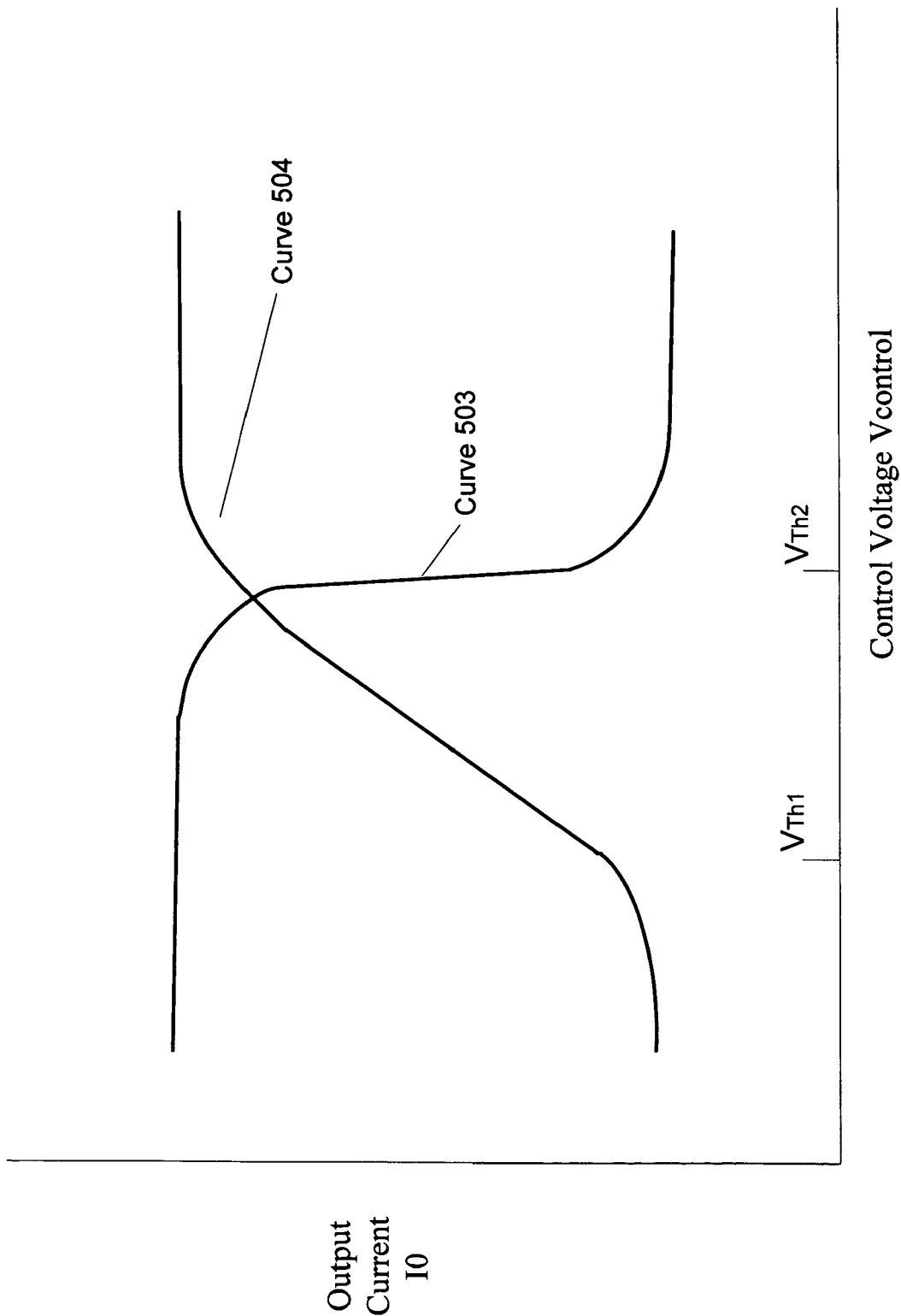
FIG. 5 shows characteristic curves for the embodiments of the invention incorporating the circuits of FIGS. 4A and 4B.

FIG. 5 shows characteristic curves for embodiments incorporating the circuits of FIGS. 4A and 4B. The 0 Hz component of the output current I0 is plotted against input voltage Vcontrol. The curve for the circuit of FIG. 4A is denoted by 503 and the curve for the circuit of FIG. 4B is denoted by 504. The superior performance of the circuit of FIG. 4B, in terms of better control, is apparent. Two threshold voltages are shown VTh1 and VTh2; these may be roughly 1.2 volts and 2.4 volts for a GaAs HBT implementation.

Figure 6:
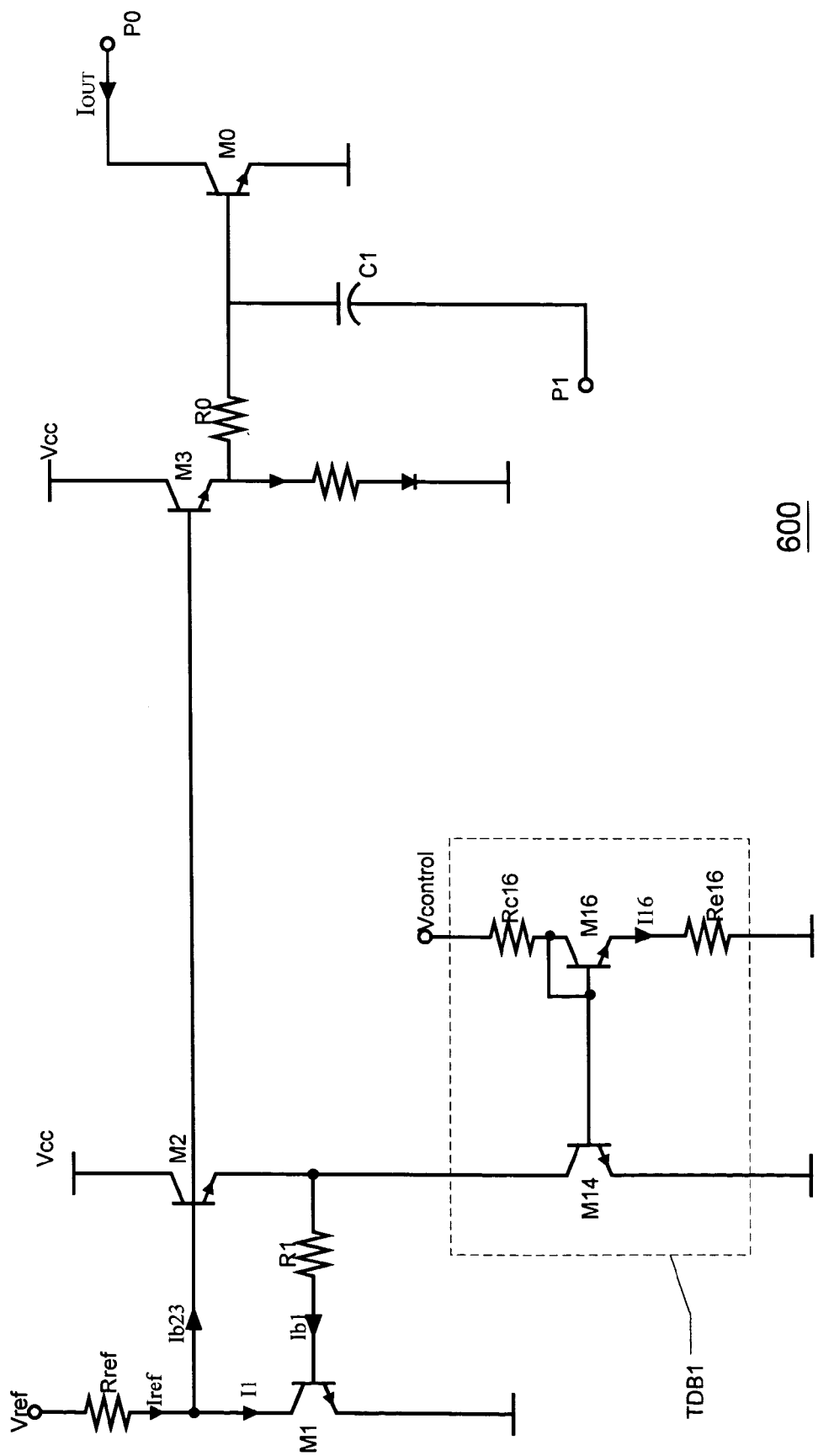
FIG. 6 is a schematic diagram of a part of another integrated circuit according to a further embodiment of the invention.

FIG. 6 is a schematic diagram of a part of another integrated circuit 600 according to a further embodiment of the invention. Contrasting FIG. 6 with FIG. 2, it may be seen that in FIG. 6 the control voltage Vcontrol acts on the temperature dependent block TDB16 in this embodiment. Moreover an exemplary embodiment of a temperature dependent block has been expanded for clarity. This embodiment of the invention may provide superior energy efficiency and economy of construction.

Still referring to FIG. 6, the temperature dependent block TDB16 may be composed of transistors M14 and M16 together with resistors Rc16 and Re16 the latter carrying current I16. Temperature-compensating block TDB16 has a number of degrees of freedom in its design. In particular, the ratios of the emitter areas of transistors M14 and M16 can be chosen with a great deal of freedom and the values of Rc16 and Re16 (or similar functioning component embodiment such as a diode junction) may be chosen at will. Circuit parameters, especially the geometry of M14 and M16 and the values of Rc16 and Re16 can each be determined by ordinary circuit simulation techniques to provide almost any desired performance over temperature. Especially the sensitivity of the circuit to the control voltage Vcontrol may be specified with a good deal of freedom.

Figure 7:
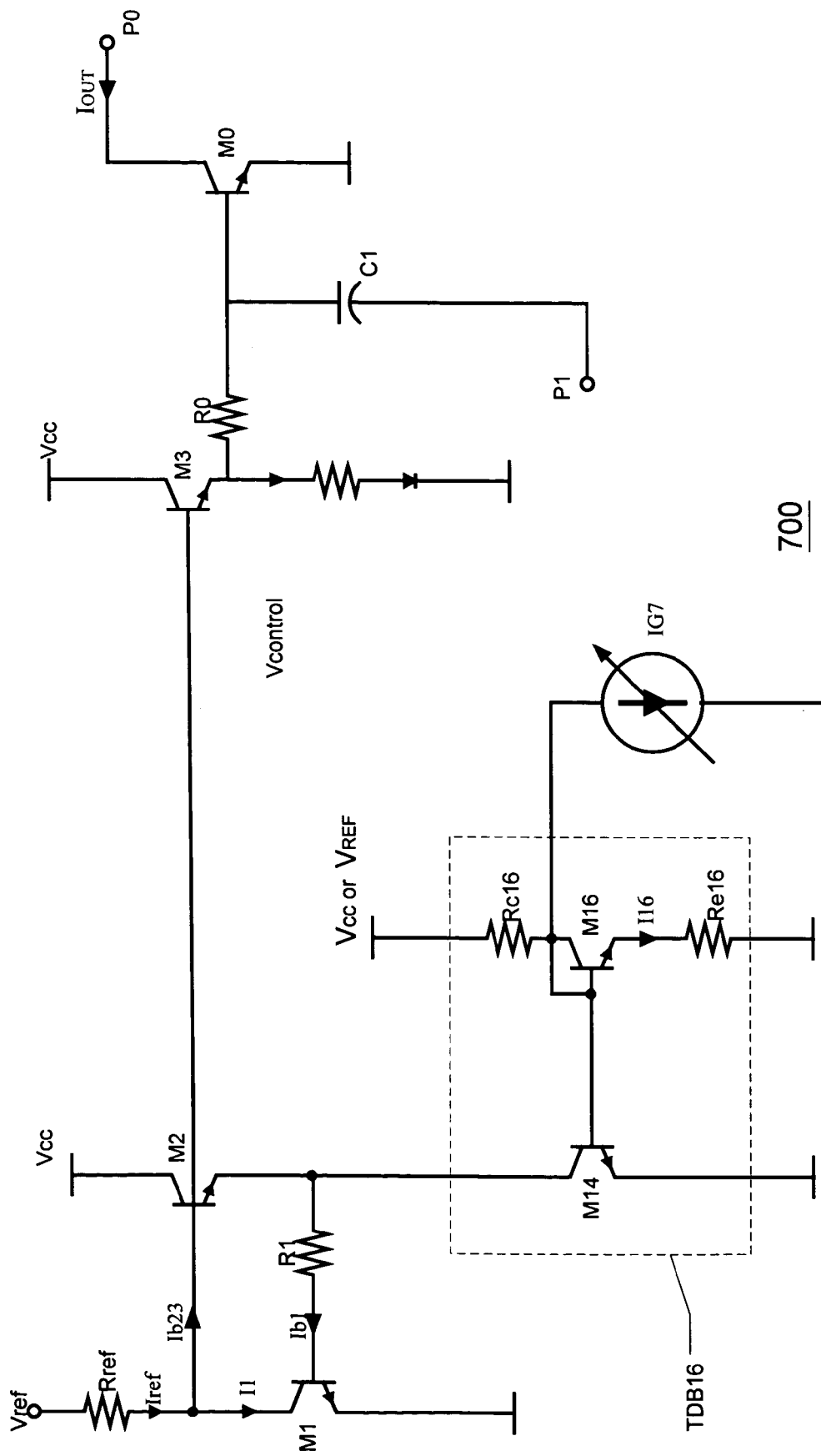
FIG. 7 shows another circuit according to a still further embodiment of the invention.

FIG. 7 shows another circuit 700 according to a still further embodiment of the invention. Contrasting FIG. 7 with FIG. 6, it may be seen that in FIG. 7 the control voltage Vcontrol has been by replaced by an adjustable current source IG7 together with a fixed source.

Figure 8:
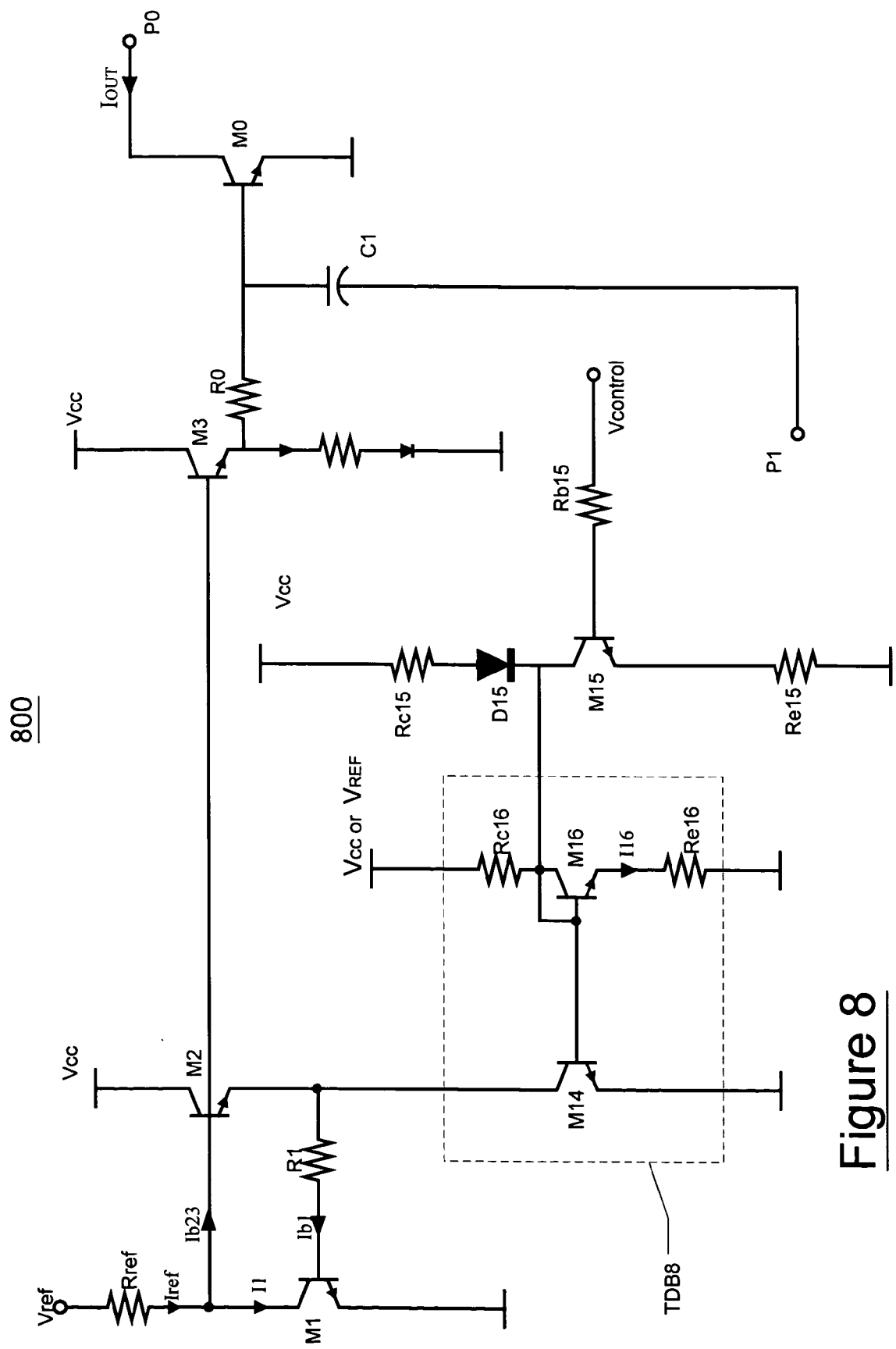
FIG. 8 shows another circuit according to an embodiment of the invention in which an adjustable current source has been expanded into component parts.

FIG. 8 shows another circuit 800 which is essentially an embodiment of the circuit 700 of FIG. 7 in which the adjustable current source has been expanded into component parts. The adjustable current source of FIG. 8 includes transistor M15 together with resistors Rc15 and Rc15 and optional diode D15. Rb15 may serve as a ballast resistor. The adjustable current source in the circuit 800 of FIG. 8 may operate in substantially the same manner as the circuit 400 of FIG. 4. Choosing a value for Re15 enables easy control of the overall sensitivity of the power amplifier to its control voltage Vcontrol.

Figure 9:
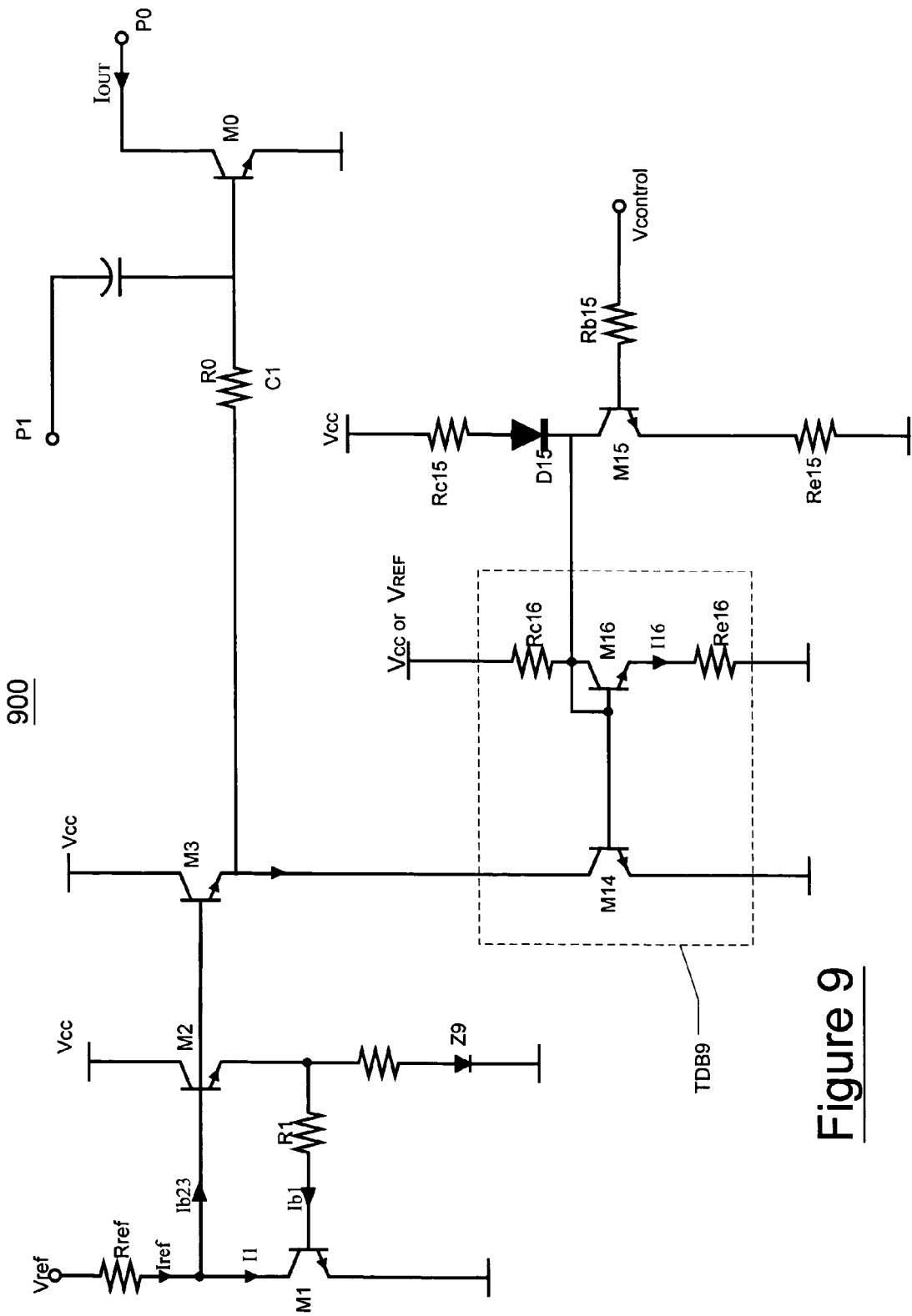
FIG. 9 shows another circuit according to a further embodiment of the invention in which a temperature dependent block with another circuit topology is exploited.

FIG. 9 shows another circuit 900 according to a further embodiment of the invention in which a temperature dependent block with another circuit topology is exploited. The placement of TDB9 and Z9 are salient features in distinguishing this particular embodiment.

Further embodiments of the invention may be extended to include other circuit configurations, especially those not limited to the use of resistors or single transistors where multiples may be substituted. And as will be apparent to one of ordinary skill in the art, still further similar circuit arrangements are possible within the general scope of the invention.

For example complementary BJT circuits interchanging current terminals (emitter for collector and vice versa are) well known. Alternatively, CMOS implementations may be provided as is well known in the art, these may use gates rather than bases as control terminals. Further examples may include circuits embodied using discrete transistors or as integrated circuits, using metal-oxide semiconductors or other field effect transistors, and/or with GaAs (Gallium Arsenide) transistors or other technologies. Indeed the features of the invention may be particularly beneficial when applied to GaAs circuits.

Other active devices could also be used to construct an embodiment of the invention using the appropriate circuit arrangements.

Also it is possible to replace analog circuit components with digital functional equivalents within the general scope of the invention. The embodiments described above are exemplary rather than limiting and the bounds of the invention should be determined from the claims.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A circuit for controlling RF amplifier gain comprising:
   an input transistor having an input transistor control terminal operable to receive an input transistor control voltage and further having an input transistor current terminal operable to pass an input current;
   a first buffer transistor having a first buffer transistor control terminal operable to receive a buffer transistor control voltage and further having a first buffer transistor current terminal operable to pass a first leakage current;
   a first leakage block operable to pass the first leakage current and further operable to generate a first leakage voltage proportional to the first leakage current;
   an output transistor having a current terminal operable to pass a current having a 0 Hz output current component and a second buffer transistor having a second buffer transistor control terminal operable to receive the buffer control voltage and further having a second buffer transistor current terminal passing a second buffer transistor current operable to control the 0 Hz output current component;

wherein the circuit generates the buffer transistor control voltage in proportion to the input current, and wherein the circuit generates the input transistor control voltage proportionate to the first leakage current, and wherein the circuit generates the input current by summation of a fixed component and a control current component from a controlling adjustable current source, whereby the adjustable current source controls the 0 Hz output current component and a gain of the output transistor.

2. The circuit of claim 1 wherein:
the first leakage block is a temperature dependent block comprising an active circuit having at least two transistors.

3. The circuit of claim 1 wherein:
the second buffer transistor current is limited controlled by a temperature dependent block comprising an active circuit having at least two transistors.

4. A circuit for controlling RF amplifier gain comprising:
an input transistor having an input transistor control terminal operable to receive an input transistor control voltage and further having an input transistor current terminal operable to pass a reference input current;
a first buffer transistor having a first buffer transistor control terminal operable to receive a buffer transistor control voltage and further having a first buffer transistor current terminal operable to pass a first leakage current;
a first leakage block operable to pass the first leakage current and further operable to generate a first leakage voltage proportional to the first leakage current, the first leakage block comprising a temperature dependent block comprising an active circuit having at least two transistors;
an output transistor having a current terminal operable to pass a current having a 0 Hz output current component and
a second buffer transistor having a second buffer transistor control terminal operable to receive the buffer control voltage and further having a second buffer transistor current terminal passing a second buffer transistor current operable to control the 0 Hz output current component;

wherein the circuit generates the buffer transistor control voltage in proportion to the reference input current, and wherein the first leakage current is controlled by a controlling adjustable source, and wherein the circuit generates the input transistor control voltage in linear relationship to the first leakage current, whereby the adjustable voltage source controls the 0 Hz output current component and a gain of the output transistor.

5. The circuit of claim 4 wherein:
the controlling adjustable source is an adjustable voltage source.

6. The circuit of claim 4 wherein:
the controlling adjustable source comprises an adjustable current source and a fixed source.

7. The circuit of claim 4 wherein:
the circuit is a HBT integrated circuit.

8. The circuit of claim 4 wherein:
the circuit is a BJT integrated circuit.

9. The circuit of claim 4 wherein:
the circuit is a CMOS integrated circuit.

10. A circuit for controlling RF amplifier gain comprising:
means for passing a reference input current;
means for passing a first leakage current;
means for generating a temperature dependent first leakage voltage proportional to the first leakage current;
means for passing a current having a 0 Hz output current component and
means for controlling the 0 Hz output current component responsive to the first leakage voltage.

11. A method for controlling RF amplifier gain comprising:
providing an input transistor having an input transistor control terminal operable to receive an input transistor control voltage and further having an input transistor current terminal operable to pass an input current;
providing a first buffer transistor having a first buffer transistor control terminal operable to receive a buffer transistor control voltage and further having a first buffer transistor current terminal operable to pass a first leakage current;
providing a first leakage block operable to pass the first leakage current and further operable to generate a first leakage voltage proportional to the first leakage current;
providing an output transistor having a current terminal operable to pass a current having a 0 Hz output current component;
providing a second buffer transistor having a second buffer transistor control terminal operable to receive the buffer control voltage and further having a second buffer transistor current terminal passing a second buffer transistor current operable to control the 0 Hz output current component;

wherein the circuit generates the buffer transistor control voltage in proportion to the input current, and wherein the circuit generates the input transistor control voltage in linear relationship to the first leakage current, and wherein the circuit generates the input current by summation of a fixed component and a control current component from a controlling adjustable current source, and operating the circuit to control the 0 Hz output current component and a gain of the output transistor responsive to the adjustable current source.

* * * * *